(12) United States Patent
Lin

(10) Patent No.: US 10,788,159 B1
(45) Date of Patent: Sep. 29, 2020

(54) SLIDE RAIL STRUCTURE FOR FIXING POWER SUPPLY TO MACHINE FRAME

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/369,321

(22) Filed: Mar. 29, 2019

(51) Int. Cl.
 *F16M 13/00* (2006.01)
 *F16M 1/08* (2006.01)

(52) U.S. Cl.
 CPC ............ *F16M 13/005* (2013.01); *F16M 1/08* (2013.01)

(58) Field of Classification Search
 CPC ................................ F16M 13/005; F16M 1/08
 See application file for complete search history.

(56) References Cited

U.S. PATENT DOCUMENTS

| | | | | |
|---|---|---|---|---|
| 6,469,889 B1* | 10/2002 | Gan | ........................ | G06F 1/184 361/679.33 |
| 8,356,718 B2* | 1/2013 | Yang | .................... | H05K 7/1489 211/26 |
| 8,496,306 B2* | 7/2013 | Chen | .................... | A47B 88/463 312/319.1 |
| 2002/0089273 A1* | 7/2002 | Weng | .................. | A47B 88/487 312/334.1 |
| 2013/0161468 A1* | 6/2013 | Chen | .................... | H05K 7/1489 248/298.1 |

* cited by examiner

*Primary Examiner* — Anita M King
(74) *Attorney, Agent, or Firm* — Sinorica, LLC

(57) ABSTRACT

A slide rail structure for fixing a power supply to a machine frame is disposed between the machine frame and the power supply. The machine frame includes at least two longitudinal left racks and at least two longitudinal right racks at two sides thereof. The slide rail structure includes two inner slide rails and two outer slide rails. One inner slide rail is laterally fixed to the two left racks, and the other inner slide rail is laterally fixed to the two right racks. The two outer slide rails are laterally locked to two sides of the power supply, respectively. The outer slide rails are slidably connected to the inner slide rails, respectively. Through the slide rail structure, the power supply won't sway left and right in the machine frame, thereby enhancing the stability of the power supply.

3 Claims, 7 Drawing Sheets

US 10,788,159 B1

SLIDE RAIL STRUCTURE FOR FIXING POWER SUPPLY TO MACHINE FRAME

FIELD OF THE INVENTION

The present invention relates to a slide rail structure, and more particularly to a slide rail structure for fixing a power supply to a machine frame.

BACKGROUND OF THE INVENTION

When a conventional power supply is to be placed in a machine frame, the power supply is first placed in the accommodating space of the machine frame, and then L-shaped fixing plates are fixed to the side walls of the rear of the power supply. The other ends of the L-shaped fixing plates are located at a rear position of the machine frame and extend toward both sides of the machine frame. The other ends of the L-shaped fixing plates are locked to the rear end of the machine frame, so that the power source can be stably disposed in the machine frame and won't sway left and right.

However, since the L-shaped fixing plates of the power supply are locked to the rear end of the machine frame from the rear, it is very inconvenient in operation. The front of the power supply is not fixed. During the process of moving the machine, the front of the power supply is easy to sway and is unstable and even hits the side walls of the machine frame to cause damage. Accordingly, the inventor of the present invention has devoted himself based on his many years of practical experiences to solve these problems.

SUMMARY OF THE INVENTION

The primary object of the present invention is to provide a slide rail structure for fixing a power supply to a machine frame. The slide rail structure is used to prevent the power supply from moving left and right in the machine frame, thereby enhancing the stability of the power supply in the machine frame.

In order to achieve the aforesaid object, a slide rail structure for fixing a power supply to a machine frame is provided. The slide rail structure is disposed between the machine frame and the power supply to guide the power supply to be mounted into the machine frame. The machine frame includes at least two longitudinal left racks and at least two longitudinal right racks at two sides thereof. The slide rail structure comprises two inner slide rails and two outer slide rails. One inner slide rail is laterally fixed to the two left racks, and the other inner slide rail is laterally fixed to the two right racks. Each of the inner slide rails includes a bottom plate and a pair of side plates extending laterally along a top edge and a bottom edge of the bottom plate. A U-shaped groove with an opening facing inward is defined between the bottom plate and the pair of side plates. Two outer slide rails are laterally locked to two sides of the power supply, respectively. Each of the outer slide rails includes a bottom plate and a pair of side plates extending laterally along a top edge and a bottom edge of the bottom plate. A U-shaped groove with an opening facing outward is defined between the bottom plate and the pair of side plates. The outer slide rails are slidably connected to the corresponding inner slide rails and slide in a same direction to form a supporting function.

The power supply provided by the invention is fixed to the slide rail structure of the machine frame, and the guiding plates of the inner slide rail guide the outer slide rail, so that the inner slide rail smoothly slides into the U-shaped groove of the outer slide rail, and the inner slide rail is slidably connected to the outer slide rail to slide in the same direction and to form a supporting function.

DETAILED DESCRIPTION OF THE PREFERRED EMBODIMENTS

Embodiments of the present invention will now be described, by way of example only, with reference to the accompanying drawings.

Figure 1:
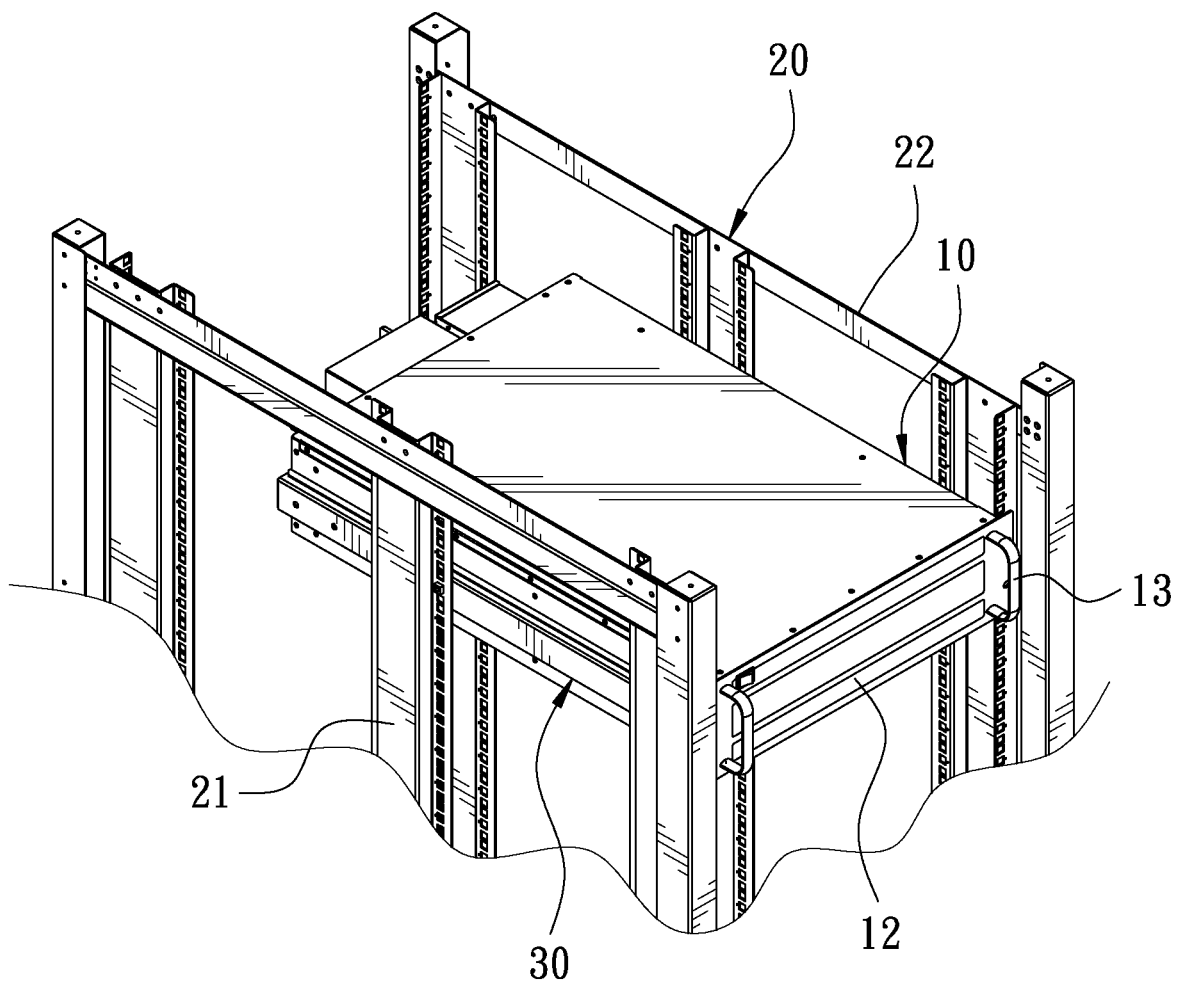
FIG. 1 is a perspective view in accordance with a preferred embodiment of the present invention.
Figure 3:
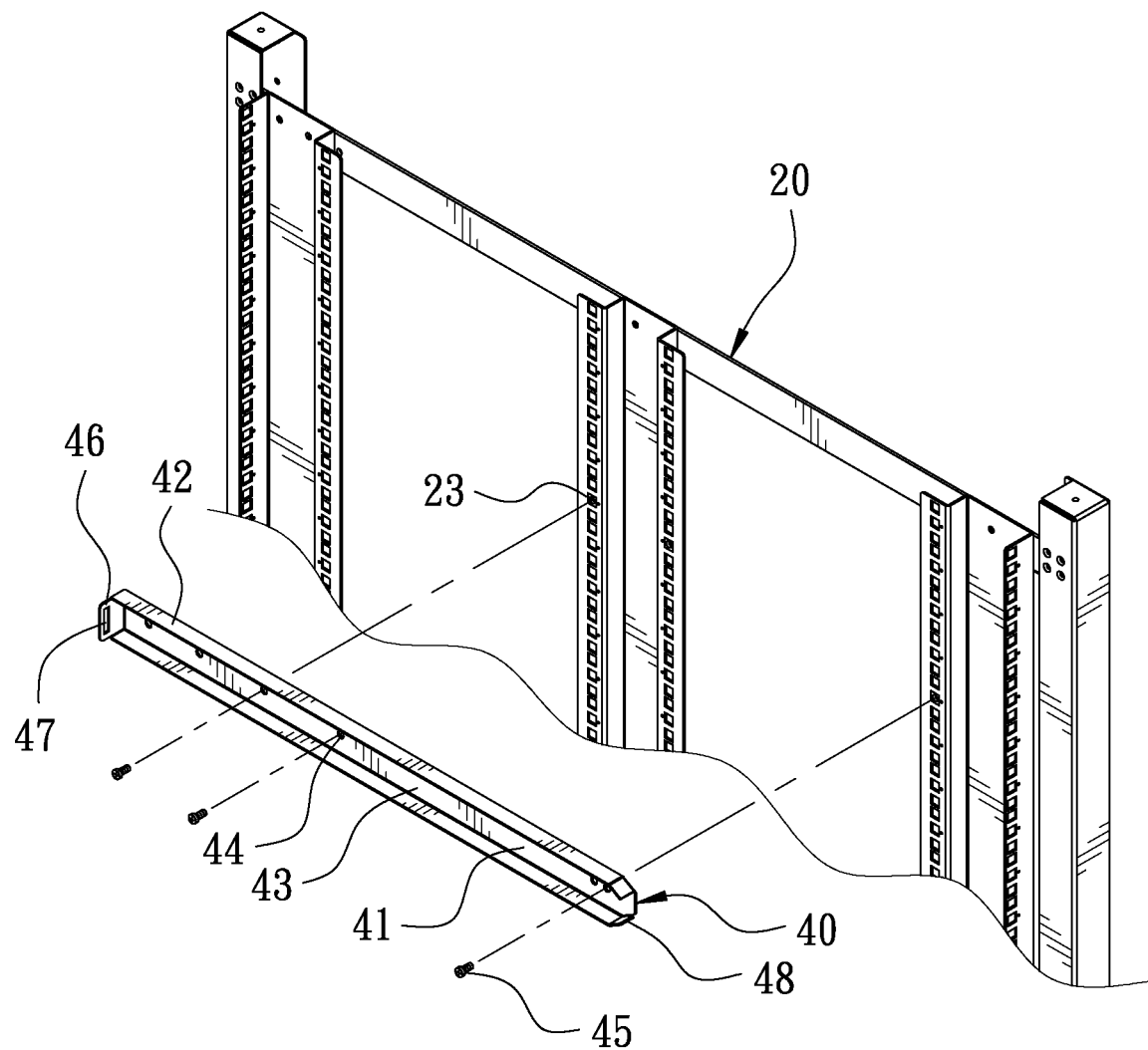
FIG. 3 is a partial exploded view in accordance with the preferred embodiment of the present invention, showing the inner slide rail to be fixed to the rack.
Figure 4:
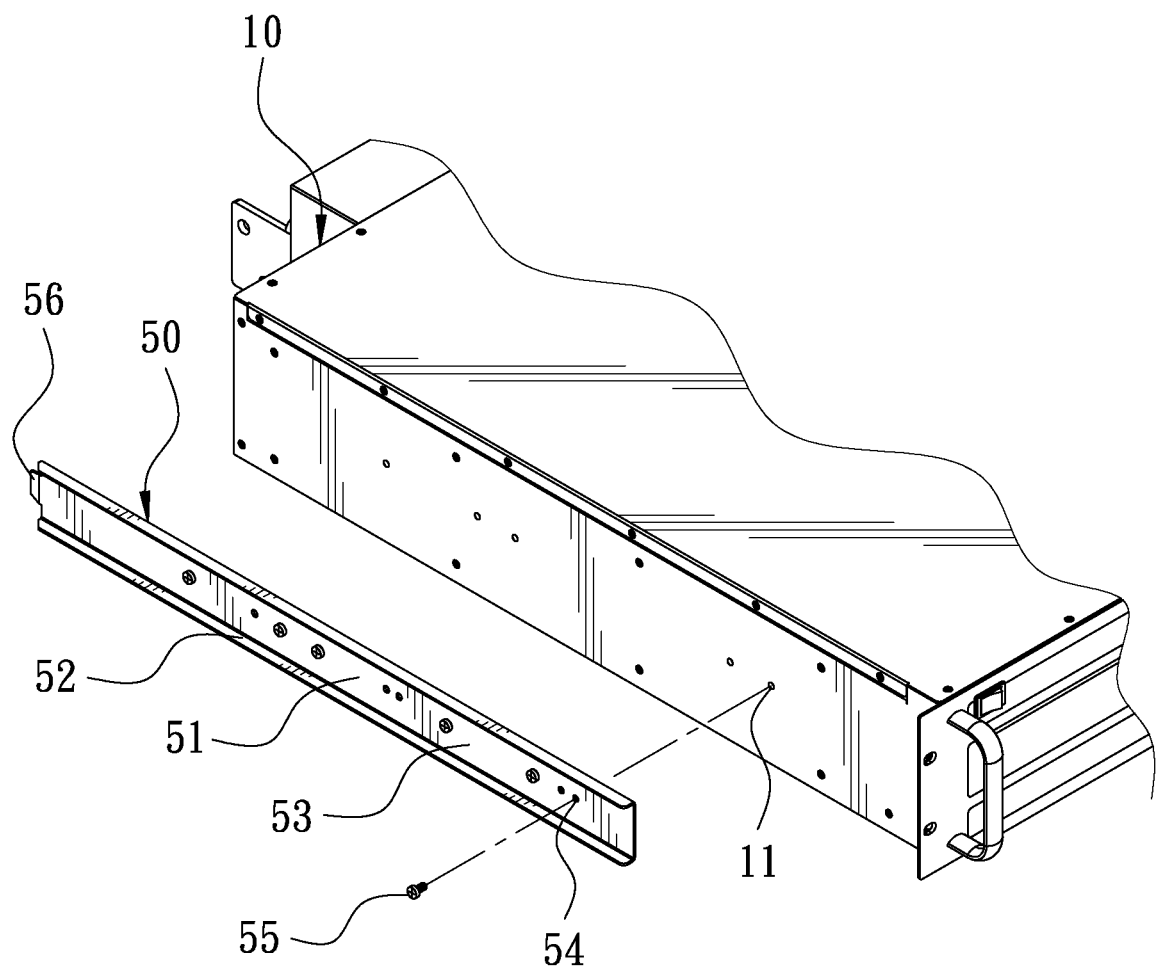
FIG. 4 is a partial exploded view in accordance with the preferred embodiment of the present invention, showing the outer slide rail to be fixed to the power supply.

As shown in FIG. 1, FIG. 3 and FIG. 4, the present invention discloses a slide rail structure 30 for fixing a power supply 10 to a machine frame 20. The slide rail structure 30 is disposed between the machine frame 20 and the power supply 10 to guide the power supply 10 to be mounted into the machine frame 20. Two sides of the power supply 10 are provided with a plurality of screw holes 11. The machine frame 20 includes at least two longitudinal left racks 21 and at least two longitudinal right racks 22 at two sides thereof. An installation space is defined between the two left racks 21 and the two right racks 22. The two left racks 21 and the two right racks 22 are provided with a plurality of spaced screw holes 23, respectively. The slide rail structure 30 comprises two inner slide rails 40 and two outer slide rails 50.

One inner slide rail 40 is laterally fixed to the two left racks 21, and the other inner slide rail 40 is laterally fixed to the two right racks 22. The two inner slide rails 40 are parallel. Each of the inner slide rails 40 includes a bottom plate 41 and a pair of side plates 42 extending laterally along a top edge and a bottom edge of the bottom plate 41. A U-shaped groove 43 with an opening facing inward is defined between the bottom plate 41 and the pair of side plates 42. The bottom plate 41 is provided with a plurality of screw holes 44. Fastening members 45 are inserted through the screw holes 44 of the bottom plate 41 and the corresponding screw holes 23 of the left racks 21 and the right racks 22, so that the two inner slide rails 40 are screwedly connected to the two left racks 21 and the two right racks 22 at predetermined positions, respectively. The bottom plate 41 is provided with a stop plate 46 relative to a front end of the power supply 10. The stop plate 46 is perpendicular to the bottom plate 41. The stop plate 46 is provided with a rectangular hole 47 for insertion of a limiting piece 56 of the corresponding outer slide rail 50.

Front ends of the pair of two side plates 42 have guiding plates 48 inclining inwardly. The guiding plates 48 are guiding slopes for guiding the outer rails 50.

The two outer slide rails 50 are laterally locked to the two sides of the power supply 10, respectively. Each of the outer slide rails 50 includes a bottom plate 51 and a pair of side plates 52 extending laterally along a top edge and a bottom edge of the bottom plate 51. A U-shaped groove 53 with an opening facing outward is defined between the bottom plate 51 and the pair of side plates 52, so that the outer slide rails 50 are slidably connected to the corresponding inner slide rails 40. The bottom plate 51 is provided with a plurality of screw holes 54. Fastening members 55 are inserted through the screw holes 54 of the bottom plate 51 and the corresponding screw holes 11 of the power supply 10, so that the two outer slide rails 50 are screwedly connected to the two sides of the power supply 10. The power supply 10 is slidably disposed between the two outer slide rails 50. Further, the bottom plate 51 is provided with a limiting piece 56 corresponding to the rectangular hole 47 of the inner slide rail 40 relative to a rear end of the power supply 10. The limiting piece 56 has a trapezoid shape.

Figure 2:
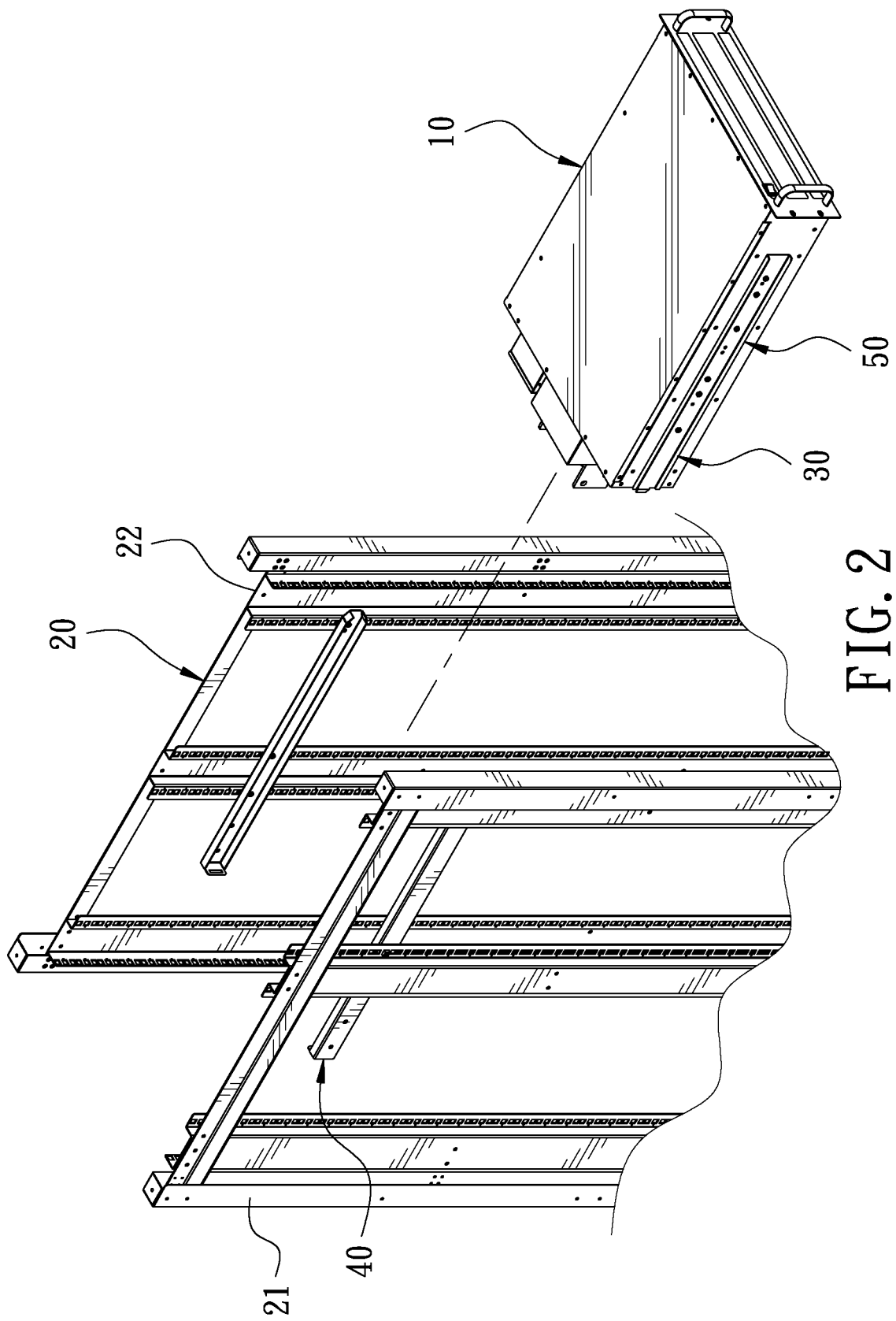
FIG. 2 is an exploded view in accordance with the preferred embodiment of the present invention.
Figure 5:
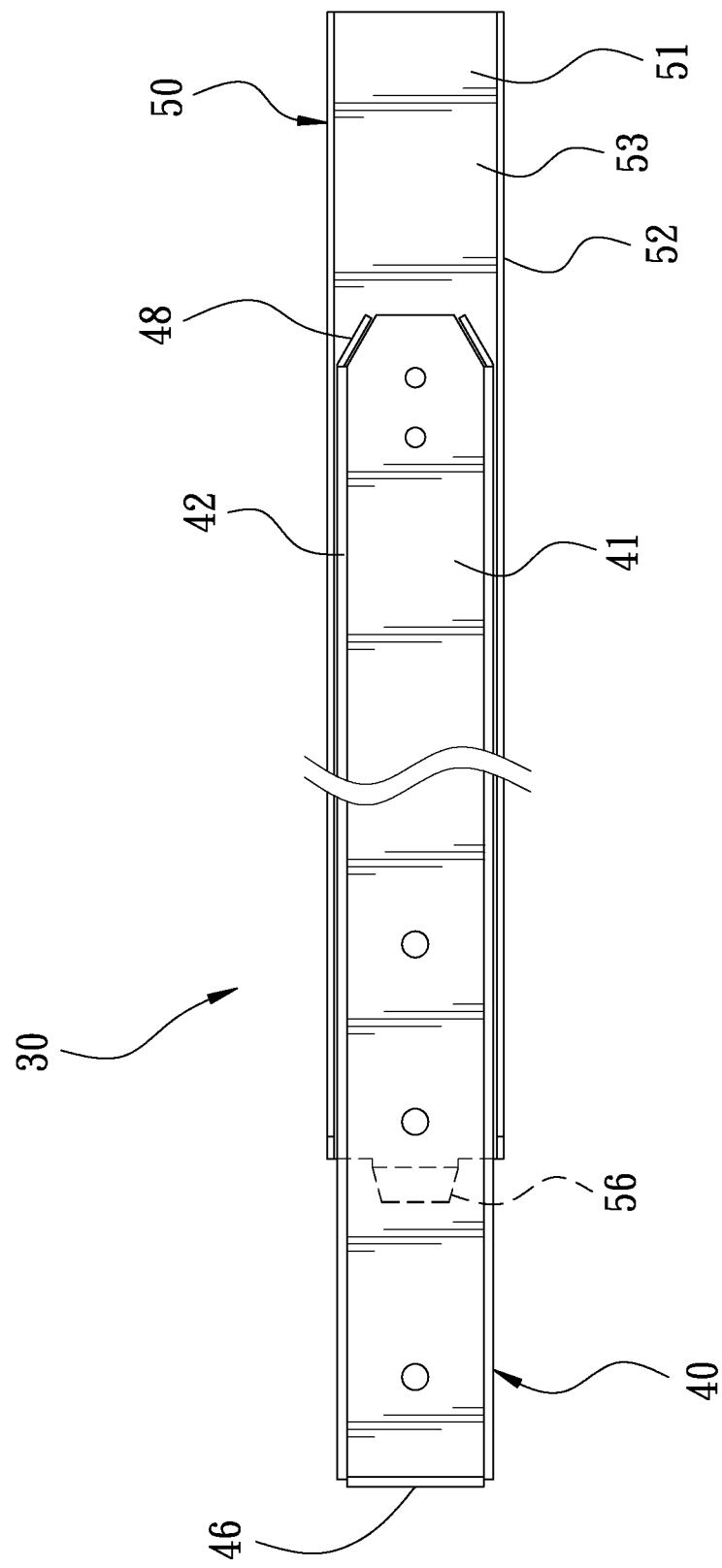
FIG. 5 is a schematic view in accordance with the preferred embodiment of the present invention, showing the assembly of the inner slide rail and the outer slide rail.

Referring to FIG. 2 and FIG. 5. First, when the power supply 10 is placed in the machine frame 20, the user only needs to push the power supply 10 into the installation space, aligning the limiting pieces 56 of the outer rails 50 with the guiding plates 48 of the inner sliding rails 40. At this time, the outer slide rails 50 can be guided to the proper position of the installation space by the guiding plates 48, so that the inner slide rails 40 can be smoothly slid in the U-shaped grooves 53 of the outer slide rails 50, and the side plates 42 of the inner slide rails 40 are abutted against the side plates 52 of the outer slide rails 50.

Figure 6:
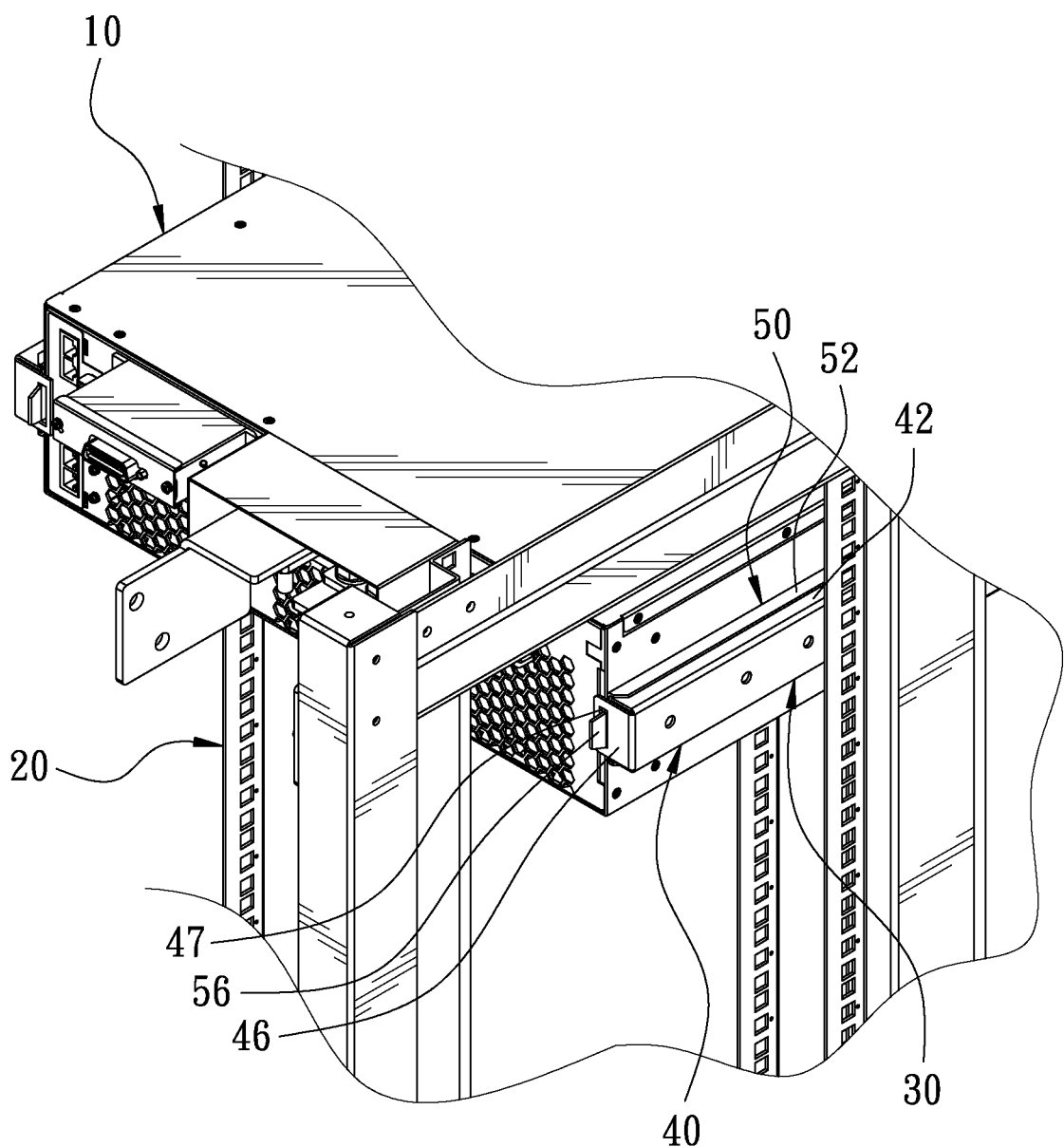
FIG. 6 is a partial enlarged view in accordance with the preferred embodiment of the present invention, showing the engagement of the inner slide rail and the outer slide rail.
Figure 7:
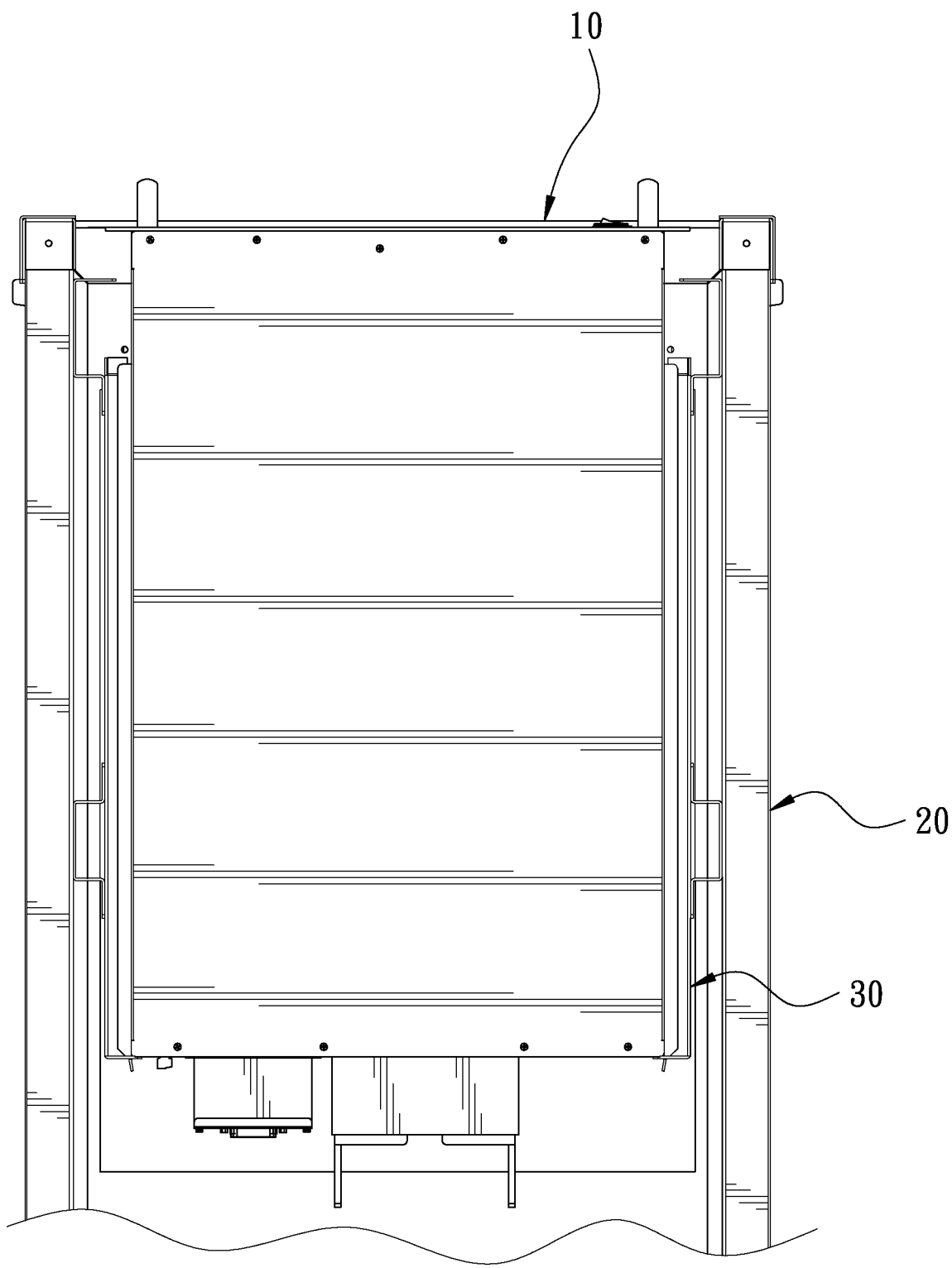
FIG. 7 is a schematic view in accordance with the preferred embodiment of the present invention, showing the power supply mounted to the rack.

Referring to FIG. 5 to FIG. 7, the power supply 10 is further pushed inward towards the installation space, so that the limiting pieces 56 of the outer slide rails 50 are inserted into the rectangular holes 47 of the stop holes 46 of the inner slide rails 40. The inner slide rails 40 and the outer slide rails 50 are engaged with each other to form a blocking function, so that the inner slide rails 40 are completely accommodated in the U-shaped grooves 53 of the outer slide rails 50, respectively. Thereby, the power supply 10 does not sway in the machine frame 20, and the stability of the power supply 10 in the machine frame 20 can be enhanced.

It is to be noted that, as shown in FIG. 1, the front end of the power supply 10 is provided with a panel 12. The panel 12 abuts against the left rack 21 and the right rack 22 to hold the power supply 10, so that the damage of the power supply 10 caused by the sway of the machine frame 20 is avoided, and the stability of the power supply 10 in the machine frame 20 is further enhanced. A handle 13 is fixed on either side of the panel 12. The handle 13 is generally U-shaped.

The user can take out the power supply 10 or put it into the machine frame 20 through the handles 13, which is faster and more convenient for use.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A slide rail structure for fixing a power supply to a machine frame, the slide rail structure being disposed between the machine frame and the power supply to guide the power supply to be mounted into the machine frame, the machine frame including at least two longitudinal left racks and at least two longitudinal right racks at two sides thereof, the slide rail structure comprising:

two inner slide rails, one inner slide rail being laterally fixed to the two left racks, the other inner slide rail being laterally fixed to the two right racks, each of the inner slide rails including a bottom plate and a pair of side plates extending laterally along a top edge and a bottom edge of the bottom plate, a U-shaped groove with an opening facing inward being defined between the bottom plate and the pair of side plates;

two outer slide rails, laterally locked to two sides of the power supply respectively, each of the outer slide rails including a bottom plate and a pair of side plates extending laterally along a top edge and a bottom edge of the bottom plate, a U-shaped groove with an opening facing outward being defined between the bottom plate and the pair of side plates, the outer slide rails being slidably connected to the corresponding inner slide rails and sliding in a same direction to form a supporting function;

the bottom plate of each of the inner slide rails is provided with a stop plate relative to a front end of the power supply, the stop plate is provided with a rectangular hole, the stop plate is perpendicular to the bottom plate of the corresponding inner slide rail, the bottom plate of each of the outer inner rails is provided with a limiting piece corresponding to the rectangular hole relative to a rear end of the power supply, and the limiting piece is inserted in the rectangular hole to form a blocking function.

2. The slide rail structure as claimed in claim 1, wherein the inner slide rails are disposed in the U-shaped grooves of the outer slide rails, respectively.

3. The slide rail structure as claimed in claim 1, wherein front ends of the pair of side plates of each of the inner slide rails have guiding plates inclining inwardly.

\* \* \* \* \*